United States Patent [19]

Becker et al.

[11] Patent Number: 5,700,580

[45] Date of Patent: Dec. 23, 1997

[54] HIGHLY SELECTIVE NITRIDE SPACER ETCH

[75] Inventors: David S. Becker; David J. Keller, both of Boise, Id.

[73] Assignee: Micron Technology, Inc., Boise, Id.

[21] Appl. No.: 301,928

[22] Filed: Sep. 7, 1994

Related U.S. Application Data

[63] Continuation-in-part of Ser. No. 89,205, Jul. 9, 1993, Pat. No. 5,387,312.

[51] Int. Cl.$^6$ ................................................. H01L 21/306
[52] U.S. Cl. .................... 428/446; 428/697; 428/938; 156/643; 156/650; 156/651; 156/652; 156/653
[58] Field of Search .................................. 056/643, 650, 056/651, 652, 653; 428/938, 446, 698

[56] References Cited

U.S. PATENT DOCUMENTS

| | | | |
|---|---|---|---|
| 5,338,395 | 8/1994 | Keller et al. | 156/643 |
| 5,374,585 | 12/1994 | Smith et al. | 437/69 |

*Primary Examiner*—W. Robinson H. Clark
*Attorney, Agent, or Firm*—Walter D. Fields

[57] ABSTRACT

A method is provided for forming a nitride spacer, in which a layer of oxide is grown superjacent a substrate and the semiconductor features disposed thereon. A layer of nitride is deposited superjacent the oxide layer, and a major horizontal portion of the nitride layer anisotropically etched with an ionized fluorocarbon compound. The remainder of the horizontal portion of the nitride layer is removed with $NF_3$ ions in combination with ionized halogen-containing compound, thereby creating nitride spacers adjacent the features.

13 Claims, 2 Drawing Sheets

HIGHLY SELECTIVE NITRIDE SPACER ETCH

This is a continuation in part application to U.S. Pat. No. 5,387,312, filed as U.S. patent application Ser. No. 08/089,205, on Jul. 9, 1993, and assigned to Micron Semiconductor, Inc.

CROSS REFERENCE TO RELATED APPLICATION

FIELD OF THE INVENTION

This invention relates to semiconductor manufacturing, and more particularly to a process for the formation of nitride spacers employing a selective nitride to oxide etch.

BACKGROUND OF THE INVENTION

"Spacers" are frequently used in semiconductor manufacturing as protective structures against subsequent processing steps. In particular, spacers are used to protect underlying source/drain areas during doping or implanting steps. The dopant material is unable to penetrate the spacer, and thus, the underlying layer remains relatively unaffected by the implanted material.

As semiconductor devices (e.g., transistors) become smaller, the spacers disposed along side them must also become smaller. Spacer formation typically involves etching, and research continues for ever better and cleaner etching processes.

In transistor formation, a nitride spacer is commonly disposed over the source/drain regions during implant steps. Some of the current processes are limited to spacer thicknesses which are only twice the thickness of the underlying oxide. See, for example, Japanese patent 5-299394 which proposes an etch process having a 2:1 nitride to oxide selectivity. This limitation with respect to nitride to oxide selectivity also limits the possible size and thickness of the nitride spacer.

SUMMARY OF THE INVENTION

The present invention relates to use of a thin oxide layer (i.e., the source/drain reoxidation layer) under a deposited nitride layer to act as an etch stop during the formation of the spacer. The use of a highly selective nitride to oxide etch prevents the nitride etch from removing the thin oxide layer, and consuming the underlying silicon in the sensitive source/drain areas of the transistor.

The process of the present invention therefore, provides a unique nitride etch that is suitable for etching submicron features, while stopping on a thin oxide layer without pitting the underlying silicon.

The present invention provides a process for forming nitride spacers by forming features on a substrate, the features having horizontal and vertical surfaces, and growing an oxide layer superjacent the features. The oxide layer is conformal. A nitride layer is deposited superjacent the oxide layer. The nitride layer is conformal. Spacers are formed from the nitride layer. The spacers are disposed adjacent the features, and have a thickness which is greater than twice the thickness of the oxide layer.

One advantage of the process of the present invention is that it enables a wide range of oxide thicknesses. The present invention provides the ability to adjust the thickness of the thin oxide (source/drain reoxidation) layer with minimal adjustment to the thickness of the nitride layer, and the subsequent nitride spacer.

Another advantage of the selective nitride spacer etch of the present invention is the ease of process measurements as compared to typical nitride spacer etches. All that is required to insure the nitride has been removed, in the process of the present invention, is a measurement of the thin oxide layer after the etch process is complete, in order to determine if the etch has partially penetrated into the source/drain reoxidation layer.

A further advantage of the process of the present invention, is the ability to adjust the spacer thickness. Control of the dimensions of the spacers enables the engineer to control the dimensions of the underlying implant regions. The ability to space the implant area away from the transistor allows the voltage threshold (VT) to be adjusted to optimize the electrical performance of the transistor.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

The process of the present invention is described and illustrated with respect to a DRAM transistor structure. However, one having ordinary skill in the art, upon being apprised of the invention, in hindsight would be able to apply it to other semiconductor devices, such as, but not limited to EPROMS, EEPROMS, and etc. The process of the present invention is not limited to the formation of spacers along gate structures, but is also adaptable to the formation of nitride spacers adjacent other semiconductor features.

Figure 1:
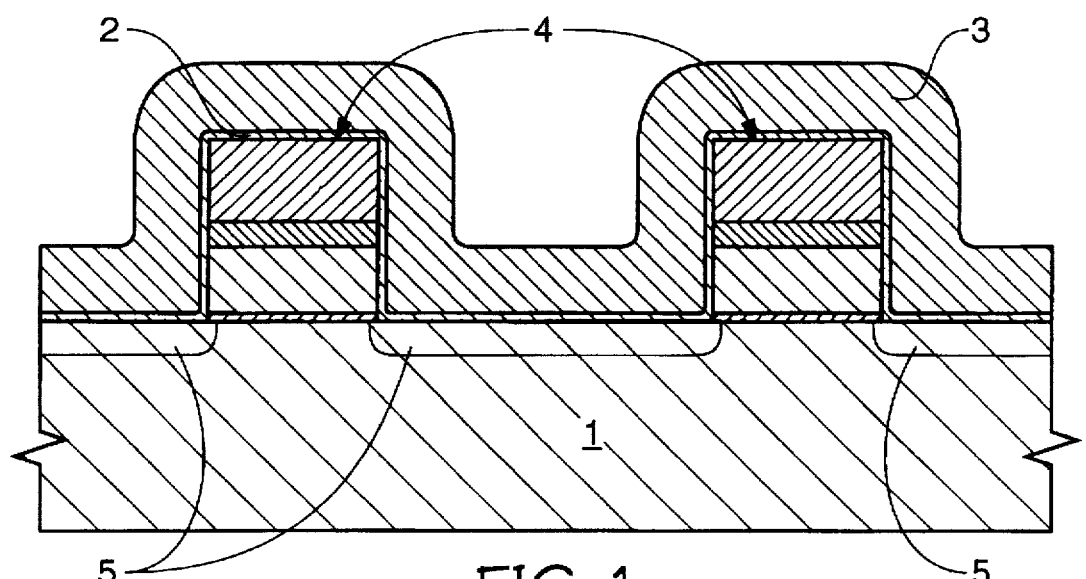
FIG. 1 is a schematic cross-section of a semiconductor gate device having oxide and nitride layers disposed thereon, according to the process of the present invention.

The formation of a nitride spacer using the selective nitride to oxide etch process of the present invention is as follows:

FIG. 1 illustrates a reoxidation 2 layer formed over transistor gate structures 4. The reoxidation layer 2 is a thin oxide layer which is preferably grown over the surface of the wafer 1. The source/drain reoxidation areas 5 are the locations of the future source/drain regions for their associated gate structures 4. The oxidation layer 2 has a thickness of less than approximately 150 Å, of which 70 Å is gate oxidation, and the additional amount is grown. Both values are adjustable to achieve the desired oxide 2 thickness.

A layer of silicon nitride 3 is disposed superjacent the thin reoxidation layer 2. The silicon nitride layer 3 has a thickness of approximately 1.6KÅ. The oxide 2 and nitride 3 layers are preferably conformal in nature.

In this particular etch, layer 3 acts as a protective or resistant area to cover the future source/drain areas 5 during the subsequent implant or doping process. The nitride layer 3 is preferably conformally deposited. There are several methods commonly known in the art to accomplish such deposition.

Figure 2:
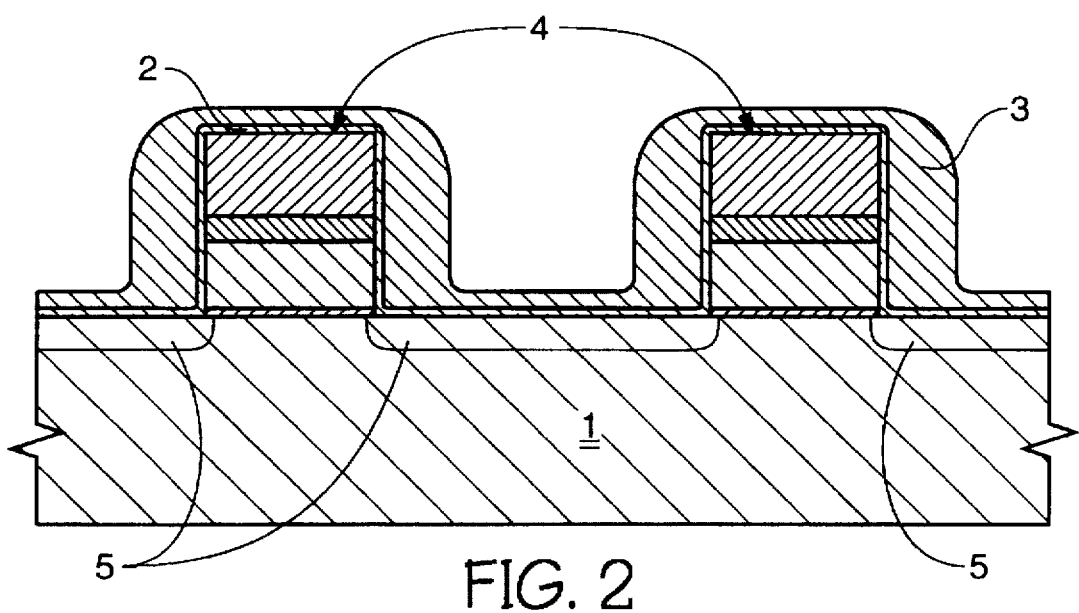
FIG. 2 is a schematic cross-section of the semiconductor gate device of FIG. 1, after a low selective nitride to oxide etch, according to the process of the present invention.
Figure 3:
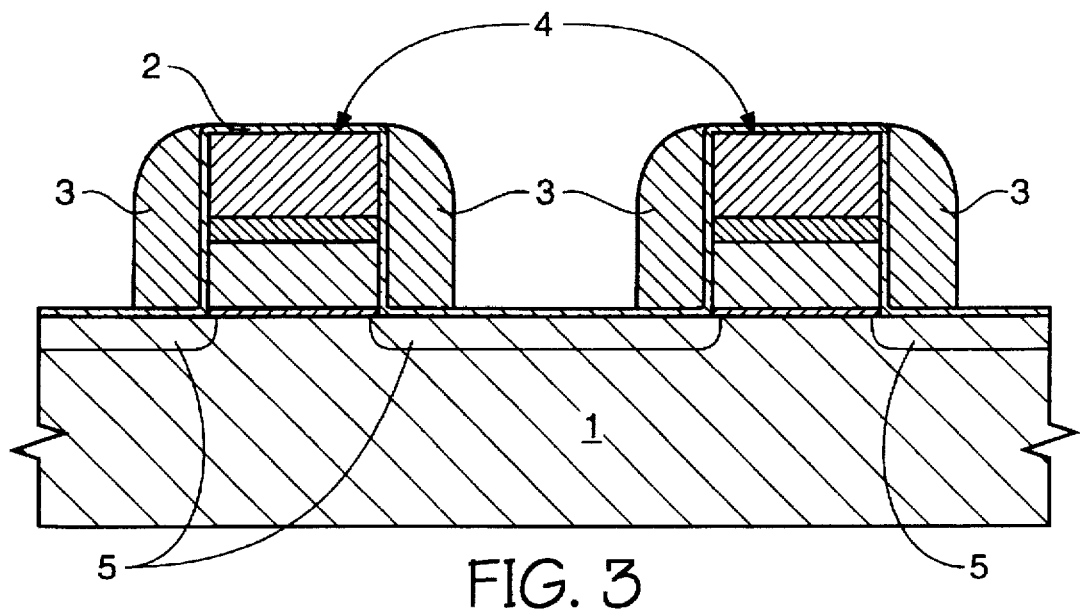
FIG. 3 is a schematic cross-section of the semiconductor gate device of FIG. 2, after a highly selective nitride to oxide etch, according to the process of the present invention.

The structure of FIG. 1 is then etched according to the process of the present invention to result in the structure depicted in FIG. 2. The etch of the present invention has a basis in the physical nature of the reaction, and more specifically, in ion bombardment.

Hence, the process of the present invention is most effective when performed in a chamber in which ions can be accelerated. Such chambers are known in the art, and include, but are not limited to, reactive ion etchers, preferably magnetically enhanced reactive ion etchers, and high density source etchers.

The present invention involves the physical impact of the ions which enables the reaction to proceed, as compared to a simple chemical reaction. While the invention anticipates chemical reaction, it uses the physical impact of the etchant chemical ions to enhance the uniformity of the etch process.

The process of the present invention comprises two etch steps, preferably performed in situ, i.e., in the same reaction chamber. The first step, is a low selective nitride to oxide etch which is used to remove a major portion of the nitride layer 3. Approximately 75% of the thickness of the nitride is removed. In the preferred embodiment, approximately 1.4KÅ of silicon nitride 3 is etched.

The preferred chemistry is approximately 50 sccm $CF_4$ and approximately 10 sccm $CHF_3$. The etch parameters are approximately 200 mtorr, at 600 Watts, and 100 Gauss.

Of course, one having ordinary skill in the art will realize that the above values will vary depending on the make and model of the etcher used in the process. The etch processes of the present invention were carried out in an Applied 5000 Magnetically Enhanced Reactive Ion Etcher, sold by Applied Materials Corporation of Santa Clara, Calif.

The low selective etch is an anisotropic etch, and therefore removes material in one direction, i.e., vertically. Hence, the nitride material 3 on the top of the gate structures 4 and along the surface of the substrate 1 is removed more quickly than the nitride material 3 on the sides of the gate structures 4. In this manner, "spacers" 3 are formed on either side of the semiconductor gate structures 4.

The process of the present invention, then employs a highly selective nitride to oxide etch to remove the remaining nitride 3 which is on the top portion of the gate structures 4 and also covering the thin oxide layer 2. The highly selective etch has an etch selectivity in the approximate range of 49:1. This means that the nitride 3 is removed at a rate 49 times faster than the oxide 2 is removed. The remaining nitride 3 in the preferred embodiment is approximately 200 Å, which is about 25% of the thickness of the deposited nitride layer 3.

The process is halted upon reaching the 150 Å of oxide layer 2 of the source/drain reoxidation The parameters for highly selective nitride to oxide etch phase of the present process are 500 mtorr, at 200 Watts, and 50 Gauss. Once again, these parameters will vary with the make and model of etcher employed in the process.

The nitride to oxide selective etch is accomplished by using an $NF_3$/HBr chemistry, as described more fully in U.S. Pat. No. 5,338,395 entitled, "Method for Enhancing Etch Uniformity Useful in Etching Submicron Nitride Features," having a common inventor with the present application, and assigned to Micron Semiconductor, Inc.

The etch chemistry comprises approximately 49 sccm $NF_3$, along with a hydrogen halide, such as, for example, HCl, HI, and HBr. The preferred embodiment employs approximately 21 sccm HBr.

The fluorine from the $NF_3$ gives a very fast nitride etch rate, while the bromine from the HBr gives a very slow oxide etch rate.

The process of the present invention results in a spacer which is substantially anisotropic. There is essentially no undercutting apparent in the nitride spacers 3. Thus, submicron features can be etched with considerable reliability.

Figure 4:
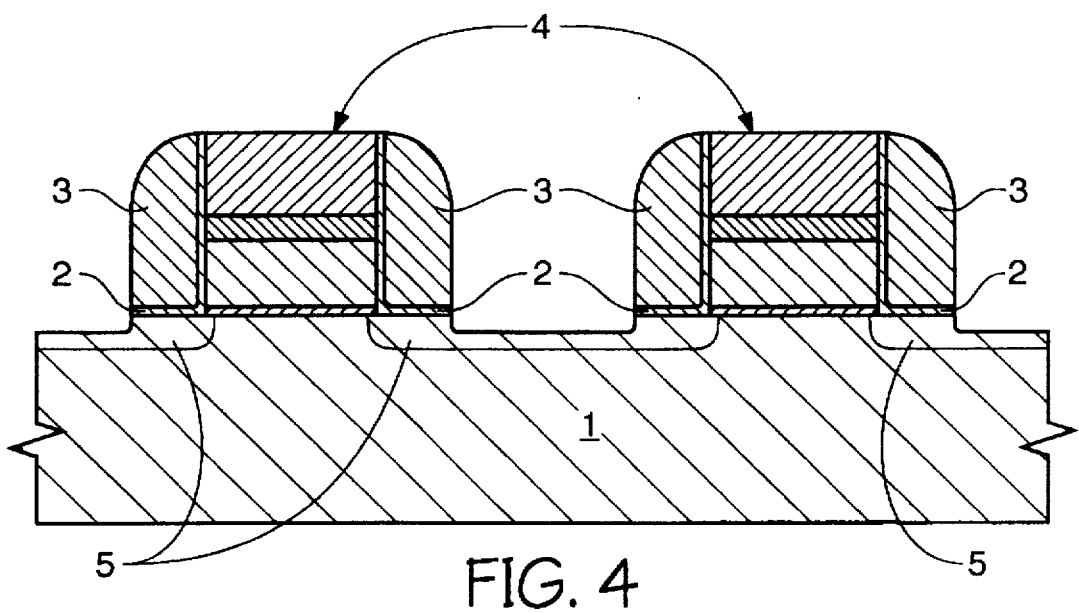
FIG. 4 is a schematic cross-section of a semiconductor gate device in which the substrate has been damaged due to overetching.

Experiments have shown that the individual steps which make up the present invention yield faulty devices if they are performed alone. If a high selective nitride to oxide etch alone is used to remove all of the nitride 3, undercutting of the gate structures 4 tends to result, thereby causing faulty transistors 4. If, on the other hand, a low selective nitride to oxide etch alone, is used to remove all of the nitride 3, most of the reoxidation layer 2 is also removed, and the substrate 1 below is consequently etched, and therefore damaged by the process, as shown in FIG. 4.

Poor nitride to oxide etches have resulted in low refresh times in DRAM semiconductor transistors because the substrate damage lessens the ability of the transistor to hold a charge. Since charge on the cell leaks more rapidly, more frequent refreshing of the cell is necessitated.

The process of the present invention overcomes the above-mentioned drawbacks. Hence, the process of the present invention results in improved semiconductor device functionality.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that the present invention is adaptable to the forming of spacers for other semiconductor devices.

What is claimed is:

1. A method of forming a nitride spacer over an underlying oxide layer, said method comprising the following steps of:

providing a substrate, said substrate having features disposed thereon;

providing a layer of oxide conformally over said substrate including said features;

providing a layer of nitride conformally over said oxide layer;

anisotropically etching a first portion of nitride material of said nitride layer without exposing oxide thereunder, said anistropic etching using a first atmosphere having an ionized fluorocarbon compound that provides a source of polymerizable elements for limiting lateral etching of said nitride layer during said anisotropic etching; and after said step of anisotropically etching, selectively removing a second portion of nitride material of said nitride layer sufficient to expose underlying oxide at given locations corresponding to regions of said nitride layer disposed on horizontal surfaces of said features, said selective removal using a second atmosphere having etching characteristics that differ from said first atmosphere, said second atmosphere comprising $NF_3$ ions in combination with an ionized halogen-containing compound so that said selective removal removes the nitride selectively with respect to the underlying oxide layer, thereby creating nitride spacers adjacent said features.

2. The method of forming a nitride spacer, according to claim 1, wherein said fluorocarbon compound comprises at least one of $CF_4$ and $CHF_3$.

3. The method of forming a nitride spacer, according to claim 2, wherein said oxide layer is provided at a thickness of about 150 Å.

4. The method of forming a nitride spacer, according to claim 3, wherein said $NF_3$ ions are provided in a combination with said ionized halogen-containing compound in a ratio of about 5:1 respectively within said second atmosphere so as to remove said nitride layer more favorably relative to said oxide layer.

5. The method of forming a nitride spacer, according to claim 3 wherein said nitride layer is provided at a thickness greater than two times the thickness of said oxide layer.

6. A process of forming nitride spacers, comprising the steps of:

providing a substrate with structural features, said features having exposed horizontal and vertical surfaces;

forming an oxide layer over said substrate features, said oxide layer being generally conformal to said structural features and having a first thickness;

providing a nitride layer over said oxide layer, said nitride layer being generally conformal and having a second thickness at least twice said first thickness of said oxide layer; and anisotropically etching said layered substrate in a first atmosphere of a first nitride-to-oxide etch selectivity;

after said step of anisotropically etching, exposing said layered substrate to a second atmosphere of a second higher, nitride-to-oxide etch selectively relative to that of said first atmosphere, thereby forming spacers from said nitride layer adjacent said vertical surfaces of said features, said spacers having thickness at least twice said first thickness of said oxide layer.

7. The process of forming nitride spacers, according to claim 6, wherein:

the step of anisotropically etching removes a first portion of the nitride material of said nitride layer in a vertical direction at given regions associated with said horizontal surfaces of said features; and the step of exposing said layered substrate to a second atmosphere selectively removes second portions of the nitride material of said nitride layer sufficient to expose said oxide layer over said horizontal surfaces of said features, the selective removal of the second portion of nitride material being selective with respect to the oxide material of said oxide layer.

8. The process of forming nitride spacers, according to claim 7, wherein said oxide layer has a thickness less than 150 Å.

9. The process of forming nitride spacers, according to claim 8, wherein said step of anisotropically etching removes at least about 75% of said nitride material of said nitride layer at said given regions using said first atmosphere comprising a fluorocarbon, said fluorocarbon comprising at least one of $CHF_3$ and $CF_4$.

10. The process of forming nitride spacers, according to claim 9, wherein said step of exposing said layered substrate to a second atmosphere removes said second portion of the nitride material of said nitride layer with an etchant chemistry for said second atmosphere comprising $NF_3$ ions in a combination with ionized halogen-containing compound in a ratio of about 5:1 respectively, providing a higher nitride-to-oxide selectivity than said first atmosphere.

11. The process of forming nitride spacers, according to claim 9, wherein said second atmosphere comprises $NF_3$ and HBr.

12. The process of forming nitride spacers, according to claim 11, wherein said selective removal of step (e) is performed after said removal of step (d), yet both of steps (e) and (d) are performed in situ within a common reaction chamber.

13. The method for forming nitride spacers, according to claim 5, wherein said nitride layer is provided with a thickness of approximately 1.6KÅ.

* * * * *